(12) United States Patent
Yip et al.

(10) Patent No.: US 7,457,117 B2
(45) Date of Patent: Nov. 25, 2008

(54) SYSTEM FOR CONTROLLING THE TEMPERATURE OF ELECTRONIC DEVICES

(75) Inventors: Tsunwai Gary Yip, San Jose, CA (US); David Nguyen, Cupertino, CA (US)

(73) Assignee: Rambus Inc., Los Altos, CA (US)

( * ) Notice: Subject to any disclaimer, the term of this patent is extended or adjusted under 35 U.S.C. 154(b) by 130 days.

(21) Appl. No.: 11/505,572

(22) Filed: Aug. 16, 2006

(65) Prior Publication Data
US 2008/0043435 A1 Feb. 21, 2008

(51) Int. Cl.
H05K 7/20 (2006.01)
(52) U.S. Cl. ............... 361/698; 361/699; 324/760; 62/3.3
(58) Field of Classification Search ............ 361/687, 361/689, 699–701, 714–720; 62/62.2, 62.3, 62/210–230, 259.2; 165/80.3, 80.4, 80.5, 165/104.33, 185, 253–256, 908; 324/158.1, 324/754, 755, 758, 760, 765; 239/443, 444, 239/463, 465; 257/706–727
See application file for complete search history.

(56) References Cited

U.S. PATENT DOCUMENTS

| | | | | | |
|---|---|---|---|---|---|
| 4,253,515 | A | * | 3/1981 | Swiatosz | 165/61 |
| 4,402,185 | A | * | 9/1983 | Perchak | 62/3.3 |
| 4,848,090 | A | * | 7/1989 | Peters | 62/3.3 |
| 4,954,774 | A | * | 9/1990 | Binet | 324/760 |
| 5,006,796 | A | * | 4/1991 | Burton et al. | 324/760 |
| 5,466,943 | A | * | 11/1995 | Green et al. | 250/493.1 |
| 5,704,220 | A | * | 1/1998 | Yamazaki | 62/259.2 |
| 5,847,366 | A | * | 12/1998 | Grunfeld | 219/497 |
| 5,918,469 | A | * | 7/1999 | Cardella | 62/3.7 |
| 5,966,940 | A | * | 10/1999 | Gower et al. | 62/3.3 |
| 6,191,599 | B1 | * | 2/2001 | Stevens | 324/760 |
| 6,501,290 | B2 | * | 12/2002 | Kvanvig et al. | 324/760 |
| 6,552,561 | B2 | * | 4/2003 | Olsen et al. | 324/760 |
| 6,728,653 | B1 | * | 4/2004 | Figueredo | 702/117 |
| 6,748,746 | B2 | * | 6/2004 | Ono | 62/3.2 |
| 6,919,734 | B2 | * | 7/2005 | Saito et al. | 324/760 |
| 6,993,922 | B2 | * | 2/2006 | Wall et al. | 62/223 |
| 7,177,007 | B2 | * | 2/2007 | Emoto | 355/30 |
| 7,224,586 | B2 | * | 5/2007 | Tustaniwskyi et al. | 361/699 |

FOREIGN PATENT DOCUMENTS

| | | | | |
|---|---|---|---|---|
| FR | 2645679 | A | * | 10/1990 |
| JP | 2005019660 | A | * | 1/2005 |

* cited by examiner

*Primary Examiner*—Michael V Datskovskiy
(74) *Attorney, Agent, or Firm*—Morgan, Lewis & Bockius LLP (57) ABSTRACT

The system for controlling the temperature of electronic devices under test includes a housing, a seal, a heat-exchanger within the housing, and a Peltier module within the housing. The housing is configured to removably enclose an electronic device coupled to a platform. The seal is configured to be positioned between the housing and the platform. The Peltier module is configured to transfer heat from the heat-exchanger to the electronic device. In use a controller measures the temperature of the electronic device and controls the Peltier module to transfer heat towards or away from the electronic device.

41 Claims, 8 Drawing Sheets

SYSTEM FOR CONTROLLING THE TEMPERATURE OF ELECTRONIC DEVICES

TECHNICAL FIELD

The embodiments disclosed herein relate to systems for controlling the temperature of electronic devices, and in particular to a small removable temperature control housing that can be positioned directly over a device under test on a platform.

BRIEF DESCRIPTION OF THE DRAWINGS

For a better understanding of the disclosure herein, reference should be made to the following detailed description taken in conjunction with the accompanying drawings, in which.

Like reference numerals refer to the same or similar components throughout the several views of the drawings.

DETAILED DESCRIPTION OF THE EMBODIMENTS

The following description describes various systems for controlling the temperature of electronic devices under test. These systems are relatively small as compared to existing environmental chambers and can be removably positioned directly over the electronic device being tested on a platform. For example, these systems may include a housing, a seal, a heat-exchanger within the housing, and a Peltier module within the housing. The housing is configured to removably enclose an electronic device coupled to a platform. The seal configured to be positioned between the housing and the platform. The Peltier module is configured to transfer heat from the heat-exchanger to the electronic device. In use a controller measures the temperature of the electronic device and controls the Peltier module to transfer heat towards or away from the electronic device.

Figure 1:
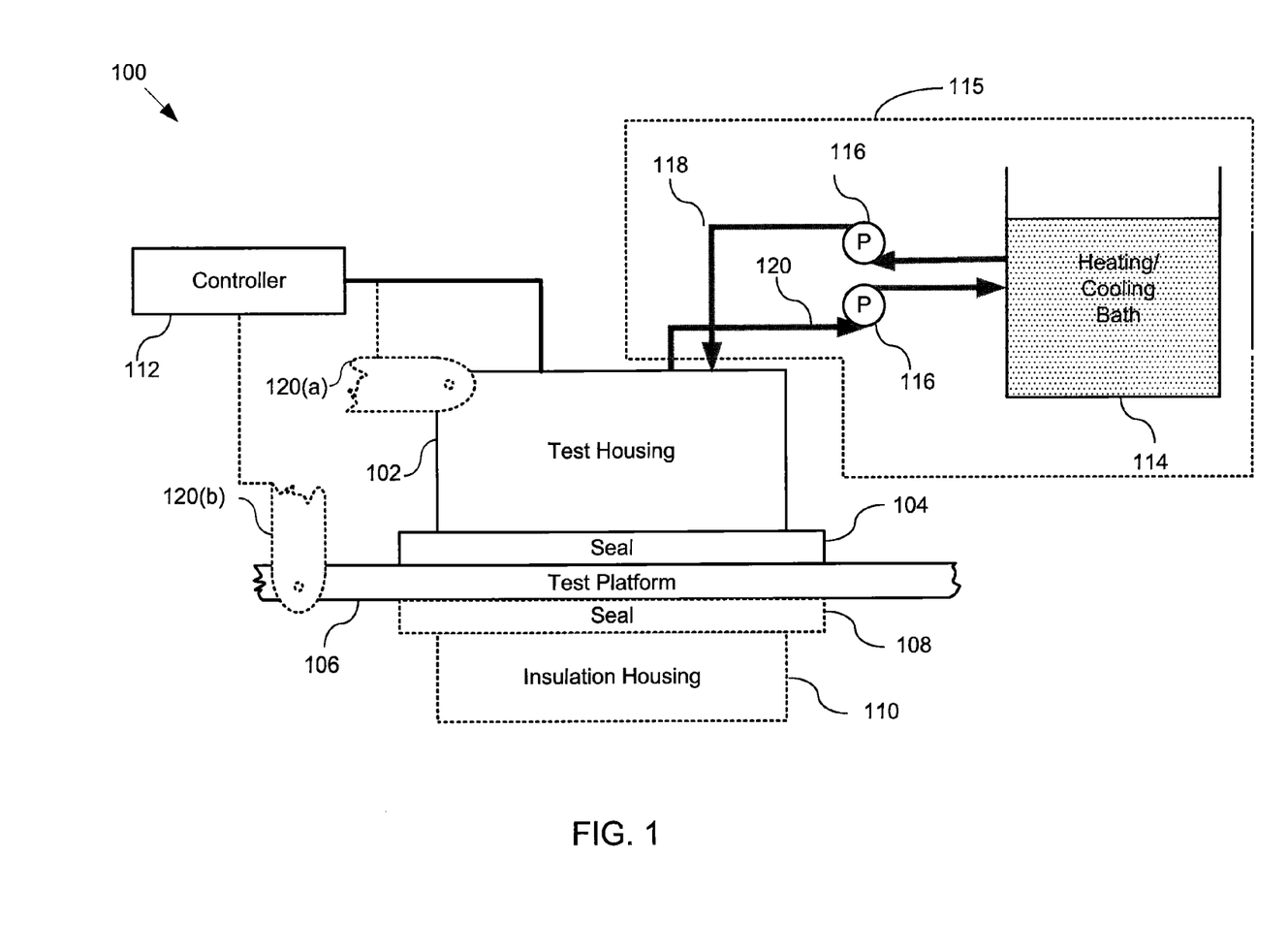
FIG. 1 is a block diagram of a system for controlling the temperature of electronic devices under test, according to a first embodiment.

FIG. 1 is a block diagram of a system 100 for controlling the temperature of an electronic device. This electronic device is otherwise referred to herein as the device. The device (not shown) is coupled to or mounted on a platform 106. The platform 106 may be a substrate, such as a printed circuit board that includes the circuitry required to electronically couple to the device. The system 100 further includes a housing 102 that is configured to be coupled to the platform 106 so as to enclose the device. A seal 104 is positioned between the housing 102 and the platform to prevent air from entering and exiting the housing. The seal also functions to insulate and thermally isolate the device within the housing 102. The seal may also act as a barrier to prevent moisture from entering the housing.

In some embodiments, the system 100 may also include an additional seal 108 and insulation housing 110 positioned on the opposite side of the platform 106 from the housing 102 to further insulate and thermally isolate the device within the housing 102. The seal may also act as a barrier to prevent moisture from entering the volume enclosed by the housing 110 on the bottom side of the platform 106. These embodiments are described in further detail below with respect to FIG. 4.

In some embodiments, the system 100 also includes a controller 112. The controller 112 may be electrically coupled to components within the housing 102, as described below in relation to FIG. 2. The controller 112 may also be coupled to a heat transfer system 115. The heat transfer system 115 may be used to transfer heat into and/or out of the housing 102. In some embodiments, the heat transfer system 115 includes a temperature controllable source, such as a heating/cooling bath 114, that is fluidly coupled to a heat-exchanger disposed within the housing 102 (described in further below in relation to FIG. 2). The heating/cooling bath 114 may contain a thermally conductive fluid therein, such as water or the like. The heating/cooling bath 114 may also be fluidly coupled to the heat-exchanger via an inlet line 118 into the heat-exchanger and an outlet line 120 out of the heat-exchanger (also described below in relation to FIG. 3A). One or more pumps 116 may be fluidly coupled to the inlet line 118 and/or the outlet line 120 to transport the thermally conductive fluid to and from the heat-exchanger. The controller 112 may manage and control the operation of the heating/cooling bath 114 and the pumps 116.

Figure 2:
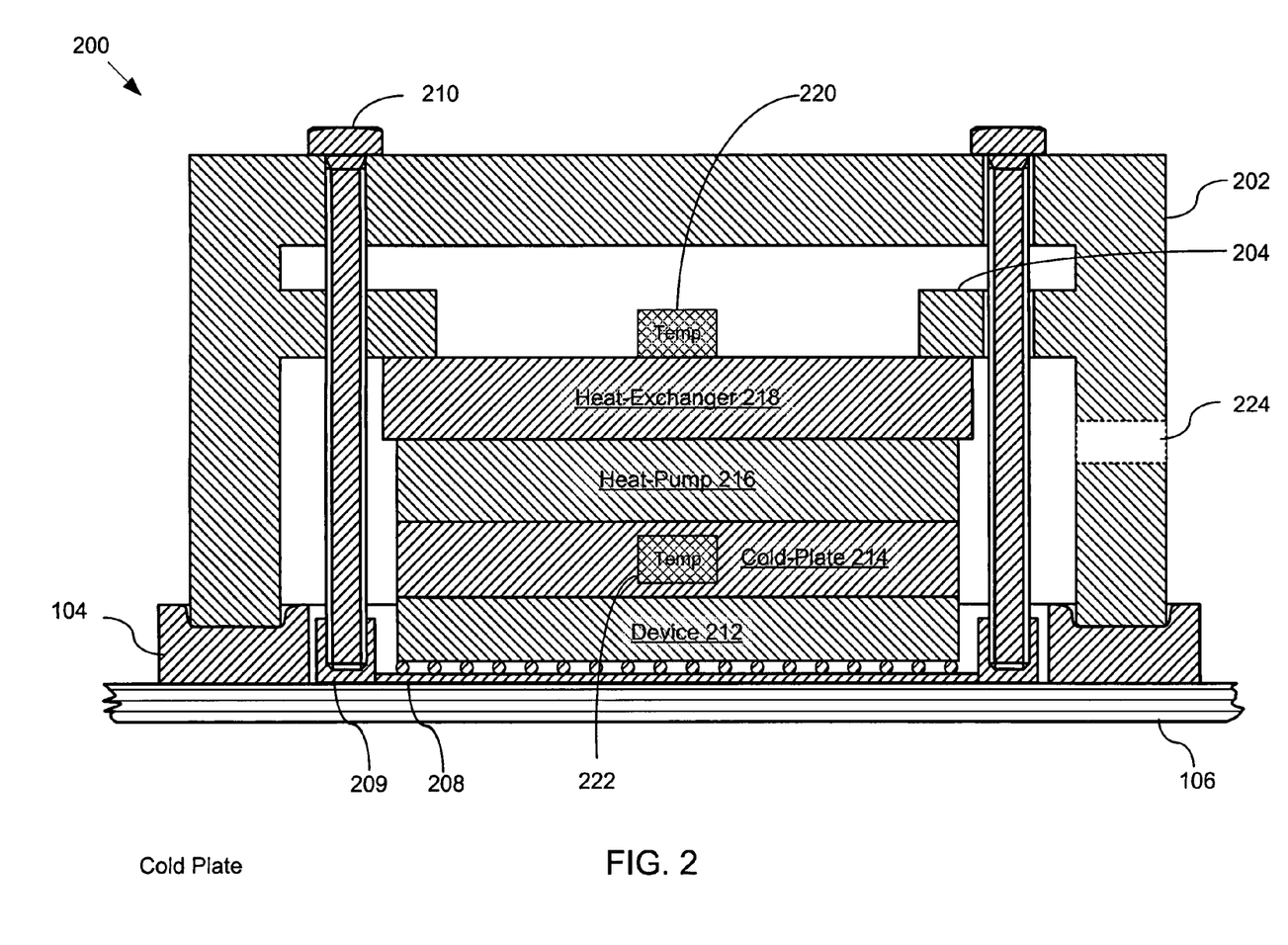
FIG. 2 is a schematic cross-sectional view of the housing shown in FIG. 1.

FIG. 2 is a schematic cross-sectional view 200 of the housing 102 and its contents as shown in FIG. 1. The housing 202 is configured to house the device 212 during testing at predetermined temperatures. In some embodiments, the device is inserted or coupled to a test socket 208 that is attached to the platform 106. Also in some embodiments, the test socket 208 includes posts 209 to which a fastening mechanism can be attached. For example, these posts 209 include screw holes therein for receiving the threaded ends of screws 210 used to attach the housing 202 to the platform 106. Alternatively, the posts 209 may be separate structures that do not form part of the test socket 208.

In some embodiments, the housing 202 is a box-shaped enclosure having five walls, i.e., two sets of opposing side walls, a top wall, and an opening opposite the top wall, where the opening is configured to receive the device 212 into the housing 202. It should, however, be appreciated that any suitable shaped housing may be used, so long as the volume of air within the housing remains low. In some embodiments, the footprint of the housing on the platform is not much larger than the device itself. The housing will generally cover one and a half to two times the size area of the device. Furthermore, the housing will not be much taller than necessary to enclose the device and any heat exchanging or measurement apparatuses. Thus the housing encloses a low volume of air, which tends to minimize any water vapor present within the housing, thereby, significantly reducing the formation of any problematic condensation within the housing. The low volume of air within the housing also tends to minimize excessive heat loss to the air surrounding the device 212.

A number of components may be stacked on top of one another within the housing to control the temperature of the device 212. These components may include one or more of: a cold-plate 214, a thermoelectric heat-pump 216, a heat-exchanger 218, and one or more temperature sensors 220 and 222. In some embodiments the thermoelectric heat-pump 216 is a Peltier module. In some embodiments, the cold-plate 214 is placed into direct contact with the device 212. In embodiments where the device 212 does not have a flat top, a compliant interface material may be provided between the cold-plate and the device. The cold-plate 214 has good thermal conduction properties, and in some embodiments is made from a metal material. Also in some embodiments, a temperature sensor 222 may be embedded or coupled to the cold-plate 214 to measure the temperature of the cold-plate 214 and the device 212. Additionally, a thermally conductive sealant or grease may be used to ensure proper heat conduction between the stacked components.

The thermoelectric heat-pump 216 may then be stacked on top of the cold-plate 214, i.e., adjacent the cold-plate 214 on the opposite side of the cold-plate 214 to the device 212. It should, however, be appreciated that any other suitable device other than a thermoelectric heat-pump or Peltier module may be used to transfer heat between the heat-exchanger and the device 212. A heat-exchanger 218 is in turn stacked on top of the thermoelectric heat-pump 216, i.e., adjacent the thermoelectric heat-pump 216 on the opposite side of the thermoelectric heat-pump 216 to the cold-plate 214. It should, however, be appreciated that the cold-plate 214 and/or thermoelectric heat-pump 216 are not required in all embodiments. In some embodiments, an additional temperature sensor 220 is attached to the heat-exchanger to monitor the temperature of the heat-exchanger 218, i.e., the temperature on a side of the thermoelectric heat-pump 216 opposite the device 212. If overheating occurs, the temperature sensor 220 will shut down the thermoelectric heat-pump 216.

In some embodiments, the housing 102 includes a lip 204 that extends into the housing from one or more of the side walls. This lip 204 contacts a side of the heat-exchanger 218 that is remote from the device 212. A fastening mechanism, such as screws 210, removably couple the housing and stacked components to the platform 106. In the embodiment shown in FIG. 2, once the components are stacked on top of the device 212, the screws are inserted through holes in the top wall of the housing 202 and the threaded ends screwed into the holes in the posts 209. This causes the lip 204 to apply a downward force (towards the device 212) on the stack of components. As the screws 210 are tightened, the seal 104 is compressed to seal the device 212 and other components within the housing 202 and to relieve the platform from the mechanical loading exerted by the housing. If the seal 104 is not compliant or compressible, a spring or elastomeric material may be used between the lip and the heat-exchanger. In some embodiments, the seal may be made from a compressible, thermally insulating material that has a minimal disturbance to the electrical impedance of the surface traces on the platform. In fact, simple home weather-stripping has been found to be an effective thermal and moisture seal. In some embodiments, a compressible thermal insulating material may be placed between the lip 204 and the heat-exchanger 218. In yet other embodiments, no lip 204 is provided, but rather, the top wall of the housing 202 contacts the top of the heat-exchanger 218 directly or via a compressible thermal insulating material.

During one mode of operation, the temperature of the device 212 is measured by the temperature sensor 222, which transmits the measured temperature back to the controller 112 (FIG. 1). To raise the temperature of the device 212 to the desired testing temperature, the controller 112 (FIG. 1) activates the heat transfer mechanism. This may be done by supplying heat to the thermally conductive fluid within the bath 114, and activating the one or more pumps 116 to drive the heated thermally conductive fluid through the heat-exchanger 218. The controller 112 (FIG. 1) then controls the thermoelectric heat-pump 216 to transfer heat from the heat-exchanger 218 to the cold-plate 214 and the device 212. The temperature sensor 222 measures the temperature of the cold-plate 214 and device 212 and transmits the measured temperature to the controller 112 (FIG. 1) so as to form a closed loop control system. Should the device 212 be operating at a temperature higher than the desired temperature, the controller 112 will remove heat from the thermally conductive fluid and reverse the direction of heat transfer by the thermoelectric heat-pump 216 from the device 212 to the heat-exchanger 218.

The temperature sensor 220 is used to determine the temperature of the heat-exchanger, while the temperature sensor 222 is used to measure the temperature of the device 212. In addition to their use for controlling the temperature of the device 212, these measured temperatures allow the controller to determine whether the heat-exchanger 218 or Peltier module 216 has failed one or more temperature limits. Although not required, in some embodiments, one or more ports 224 may be provided in the housing's walls so that a vacuum can be drawn, dry gas can be introduced into the housing, inert gas could be introduced into the housing, heated gas could be introduced into and/or expelled from the housing, and/or cooled gas can be introduced into and/or expelled from the housing.

Figure 3A:
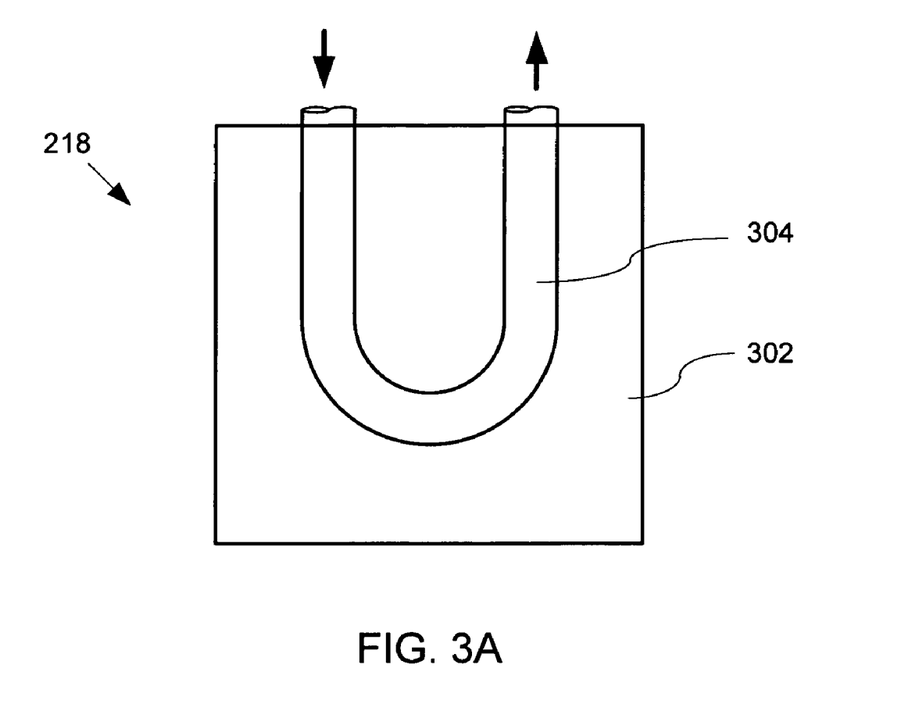
FIG. 3A is a top view of the heat-exchanger shown in FIG. 2.

FIG. 3A is a top view of the heat-exchanger 218 shown in FIG. 2. In some embodiments, the heat-exchanger 218 includes a plate 302 having good thermal conduction properties, such as a metal material. The heat-exchanger 218 includes an inlet for receiving a thermally conductive fluid and an outlet for expelling a thermally conductive fluid. The inlet and outlet are coupled to one another via a conduit 304. The conduit may also be made from a material having good thermal conduction properties, such as a metal material, e.g., copper piping. The conduit 304 is mechanically and thermally coupled to the plate 302, such as via a weld at their interfaces. The heat-exchanger 218 may also be nickel plated for aesthetics and to prevent corrosion. The conduit 304 may have a single bend, as shown, or may include any tortuous path to provide good thermal exchange between the thermally conductive fluid and the plate 302. The conduit 304 may include a section of the same or different shape populated internally with multidimensional structures to enhance the thermal exchange.

Figure 3B:
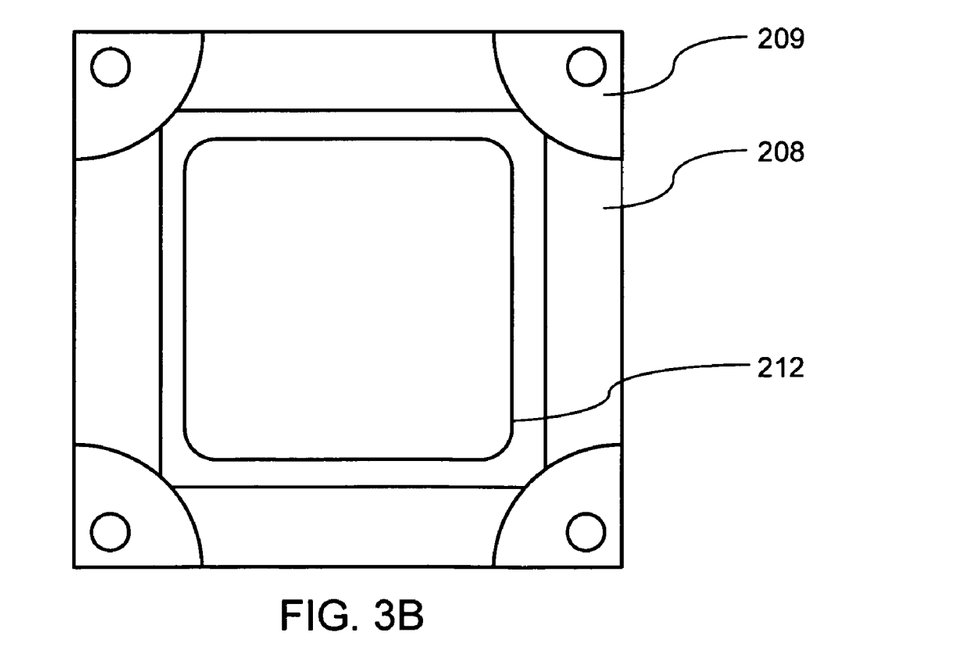
FIG. 3B is a top view of the test socket and electronic device shown in FIG. 2.

FIG. 3B is a top view of the test socket 208 and the device 212 shown in FIG. 2. As shown, in some embodiments the device 212 is inserted into the test socket 208, which is mounted to the platform 106 (FIG. 2). As shown in this embodiment, the test socket 208 includes four posts 209 with holes formed therein for receiving the screws 210 shown in FIG. 2.

Figure 4:
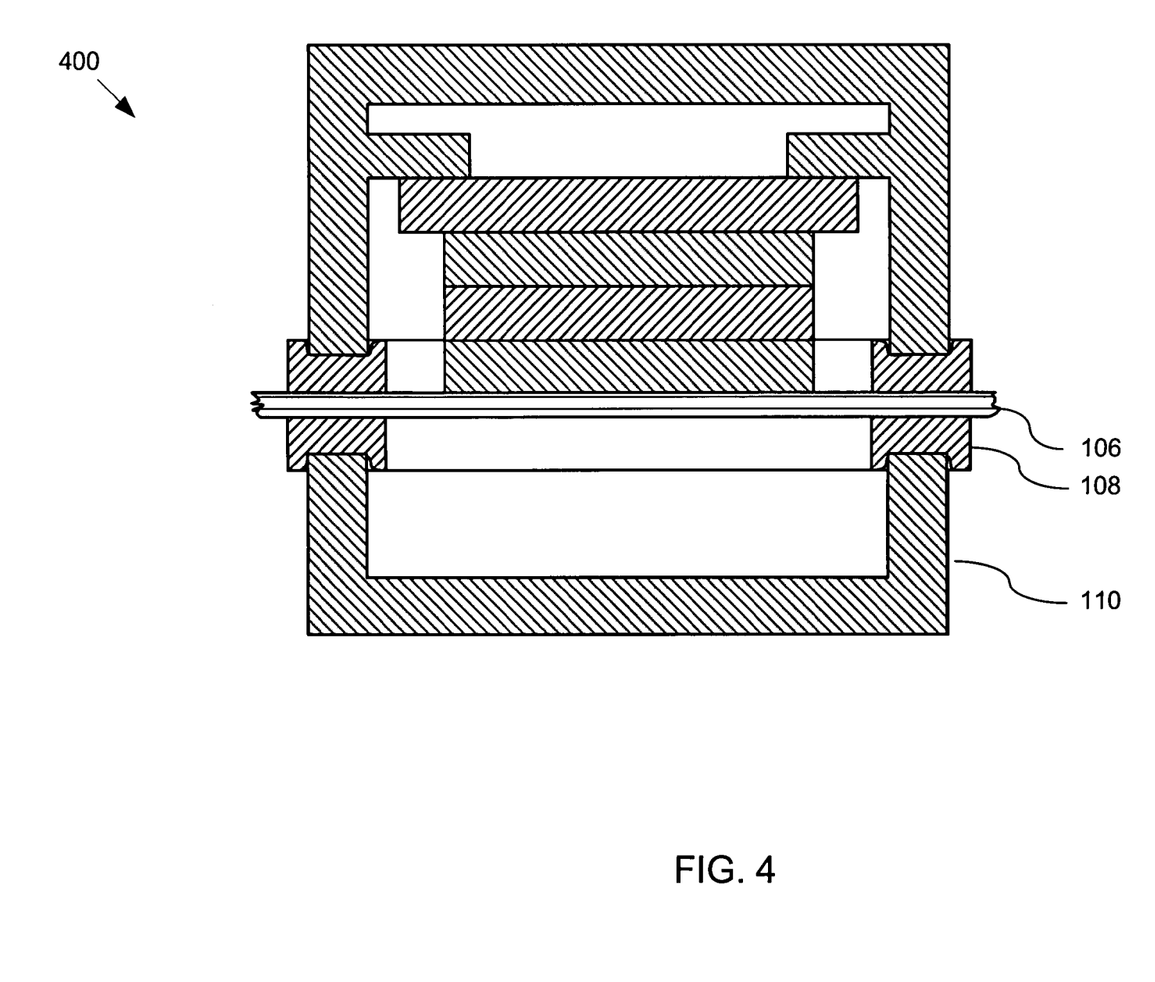
FIG. 4 is a schematic cross-sectional view of another embodiment of the system.

FIG. 4 is a schematic cross-sectional view of another embodiment 400. To reduce thermal losses through the platform 106, an additional housing 110 and seal 108 is positioned on the opposite side of the platform 106 to the device. The additional housing 110 and seal 108 are similar to the housing 202 and seal 104 shown in FIG. 2.

Figure 5:
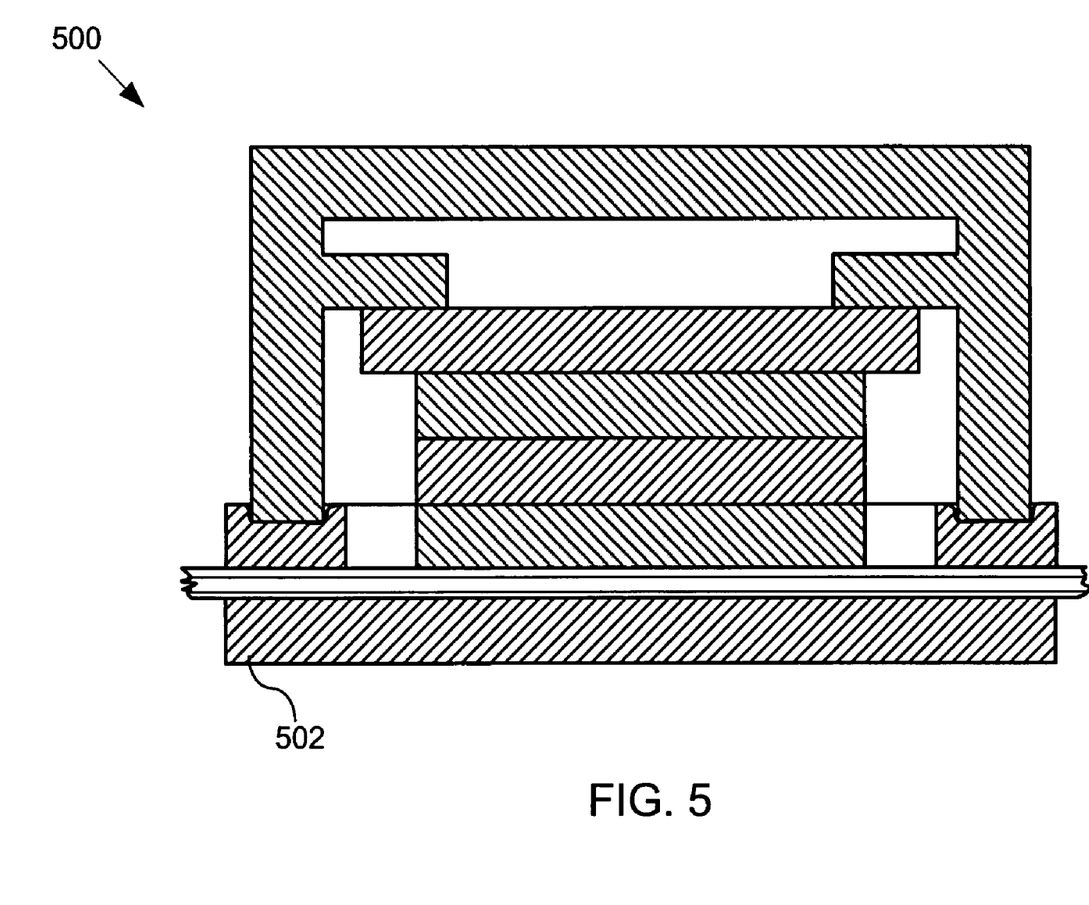
FIG. 5 is a schematic cross-sectional view of yet another embodiment of the system.

FIG. 5 is a schematic cross-sectional view of yet another embodiment 500. Here, to reduce thermal losses through the platform 106, an additional seal 502 is positioned on the opposite side of the platform 106 to the device. The additional seal 502 is made from a thermal insulating material and has an area that is at least as large as the size of the device and/or housing, i.e., is not simply an annular strip, but rather a continuous layer of insulating material, provided that it does not affect the electrical operation.

Figure 6A:
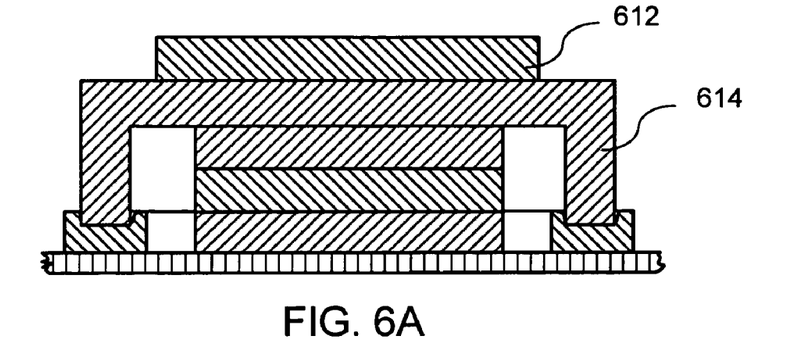
FIGS. 6A-6C are schematic cross-sectional views of other embodiments of the system having different heat-exchanger configurations.
Figure 6B:
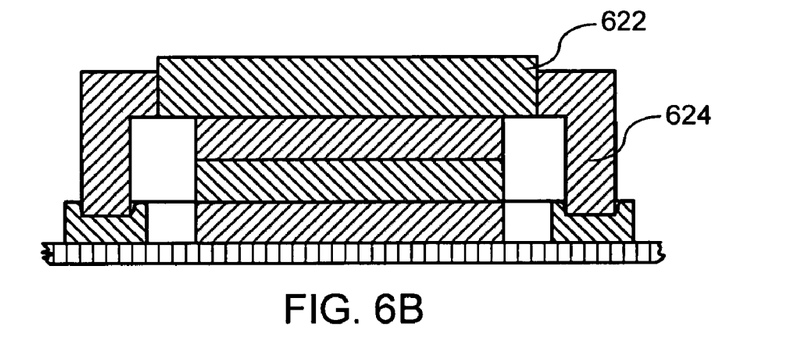
Figure 6C:
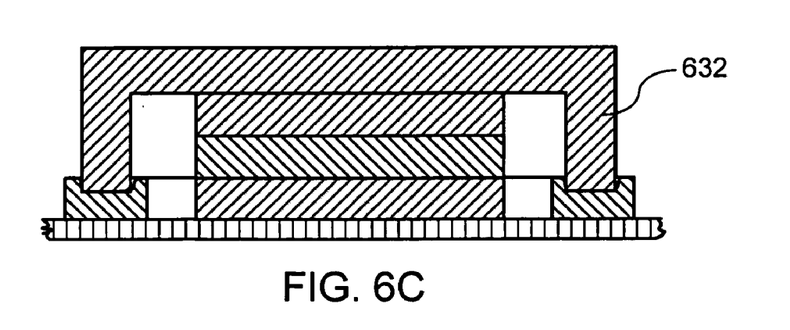

FIGS. 6A-6C are schematic cross-sectional views of other embodiments having different heat-exchanger configurations. FIG. 6A is an embodiment where the heat-exchanger 612 is positioned outside of the housing, i.e., on an opposite side of the top housing wall 614 to the device. In this embodiment, at least the top wall of the housing is made from a material having good thermal conductive properties. FIG. 6B is an embodiment where the heat-exchanger 622 is embedded into the housing wall 624. FIG. 6C is an embodiment where the housing 632 is the heat-exchanger. Here, thermally conductive fluid is passed through passages formed in the walls of the housing.

Figure 7A:
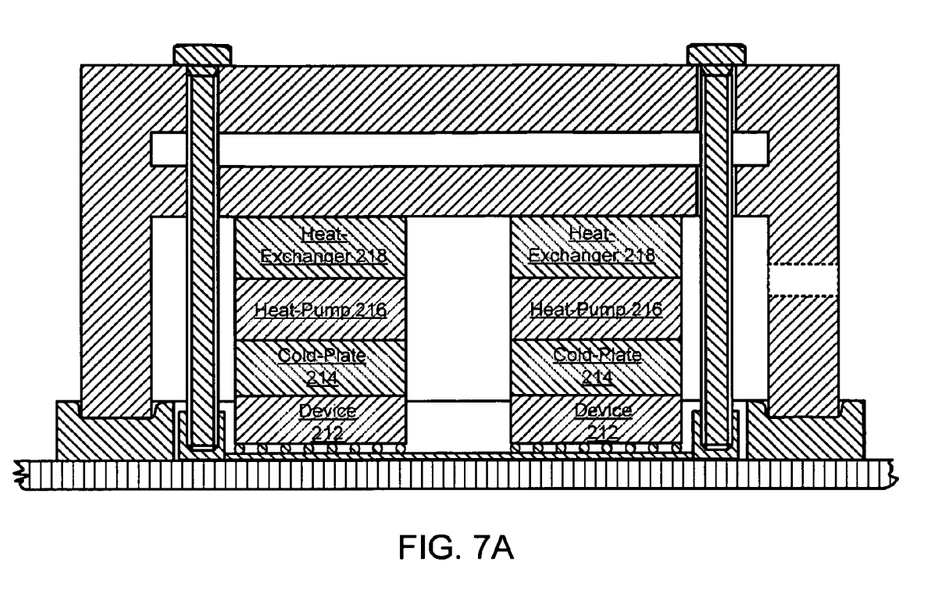
FIGS. 7A-7D are schematic cross-sectional views of other embodiments having more than one device in the housing.
Figure 7B:
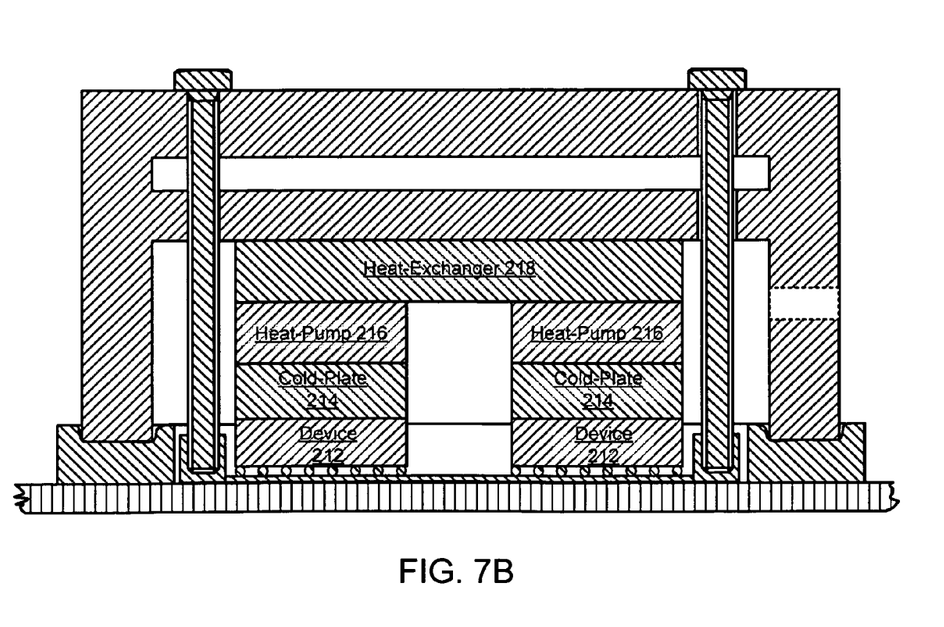
Figure 7C:
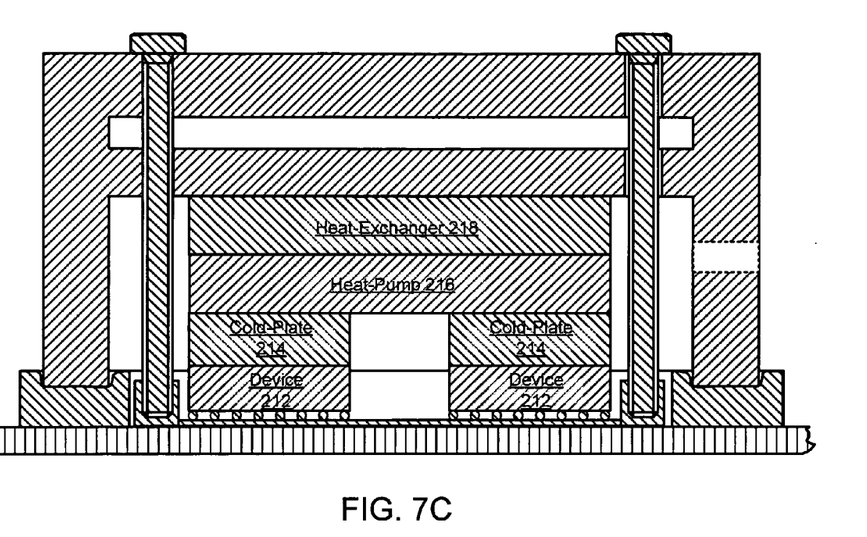
Figure 7D:
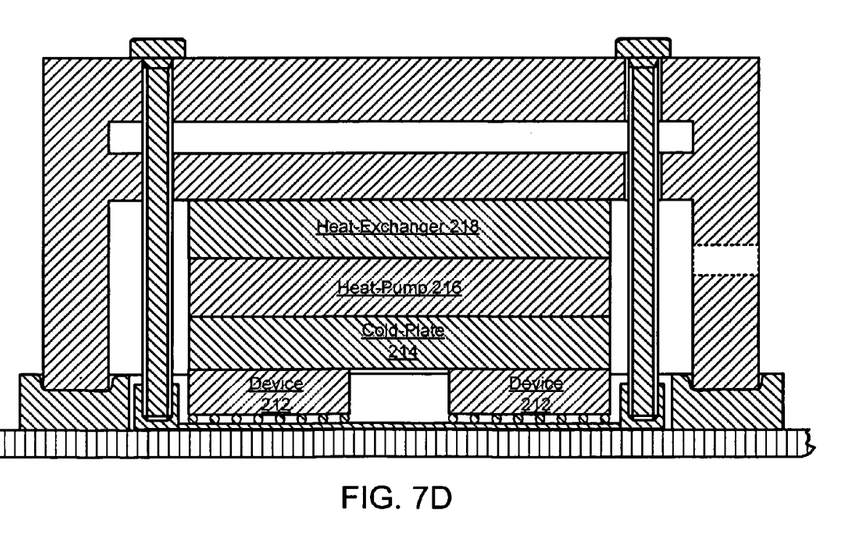

In some embodiments the housing may enclose multiple devices. FIGS. 7A-7D are schematic cross-sectional views of some of these embodiments having more than one device in the housing. FIG. 7A shows an embodiment with two devices 212. Each device includes its own cold-plate 214, heat-pump 216 and heat-exchanger 218 stacked one on top of the other. FIG. 7B is similar to FIG. 7A, however, in this embodiment, a single heat-exchanger 218 is shared between both stacks above each device. FIG. 7C is similar to FIG. 7B, however, in this embodiment, both a single heat-exchanger 218 and a single heat-pump 216 is shared between both stacks above each device. FIG. 7D is similar to FIG. 7C, however, in this embodiment, both a single heat-exchanger 218, a single heat-pump 216, and a single cold-plate is shared between both stacks above each device. Several alternative configurations of one or more of devices and other components within a housing may also be provided.

The above described systems all have housings that enclose low volumes, thereby, reducing the potential for condensation and reducing heat loss to the ambient air surrounding the device within the housing. These systems are also small and portable, thereby facilitating in-situ testing on the platform, i.e., the platforms do not need to be transported and mounted in a remote environmental chamber. As such the overall cost and complexity of manufacture and operation of the system is significantly lower than existing environmental chambers.

In one mode of operation the system 100 is configured to enable the electrical testing of the device 212. The device 212 is electrically coupled to the platform 106. A testing mechanism (not shown) for measuring and/or verifying the operation of the device 212 is provided and is electrically coupled to the device through the test platform. The system 100 is used to maintain the temperature of device 212 during operation of device 212. During the operation of the device 212 the testing mechanism is used to measure and/or verify the operation of device 212. In some modes of operation, the electrical testing of the device 212 is repeated after the controller 112 in the system 100 receives instructions from a testing mechanism to change the temperature of the device 212 to a new value. The temperature of the device 212 is recorded by a testing mechanism, which may be the same or different testing means for collecting other data for verifying the operation of device 212.

In high volume testing, test platforms can be transported into a test zone one at a time where the above described systems is placed over the device by an arm manually or automatically. Contact between the housing and the thermal seal is established by a predetermined displacement of the arm. Screws are not required to secure the housing to the test platform.

In another mode of operation the system 100 is configured to enable the automated testing of multiple devices in sequence. The housing 102 may be attached to a mechanism, such as a mechanical arm (120(a) or 120(b)-FIG. 1), to allow attaching and unattaching of the housing to the platform. Alternatively the test housing can be held stationary while the platform is configured to removably attach to the housing. The system is configured such that multiple devices on a single platform or multiple devices on multiple platforms may be tested in sequence. For example, the housing 102 may be lowered using a mechanical arm 120(a) or 120(b) and fastened to the platform 106. Testing of the device may occur as described above. The mechanical arm may then unfasten the housing from the platform. Then the housing may be relocated over a next device by moving the mechanical arm. The procedure is then repeated for the next device. Alternatively, the next device may be moved while the housing is kept stationary.

While the foregoing description and drawings represent the preferred embodiments of the present invention, it will be understood that various additions, modifications and substitutions may be made therein without departing from the spirit and scope of the present invention as defined in the accompanying claims. In particular, it will be clear to those skilled in the art that the present invention may be embodied in other specific forms, structures, arrangements, proportions, and with other elements, materials, and components, without departing from the spirit or essential characteristics thereof. For example, while the disclosed embodiments are directed to laboratory thermal test of electronic devices, the same systems may be employed to control the temperature of dies, integrated circuits, modules or other electronic equipment and prevent condensation during operation in high performance workstations, manual and automated production testers, or the like. The presently disclosed embodiments are therefore to be considered in all respects as illustrative and not restrictive, the scope of the invention being indicated by the appended claims, and not limited to the foregoing description.

What is claimed is:

1. A system for controlling the temperature of electronic devices under test, the system comprising:
   a housing configured to removably enclose an electronic device coupled to a platform;
   a seal configured to be compressed directly between the housing and the platform; and
   a heat transfer mechanism coupled to the housing and configured to transfer heat between the heat transfer mechanism and the electronic device.

2. The system of claim 1, wherein the housing has five walls that define an open side configured to receive the electronic device there through.

3. The system of claim 1, further comprising a fastening mechanism configured to removably attach the housing to the platform.

4. A system for controlling the temperature of electronic devices under test, the system comprising:
   a housing configured to removably enclose an electronic device coupled to a platform;
   a seal configured to be positioned between the housing and the platform; and
   a heat transfer mechanism coupled to the housing and configured to transfer heat between the heat transfer mechanism and the electronic device, wherein the fastening mechanism is one or more screws that are configured to attach the housing to the platform.

5. The system of claim 1, wherein the heat transfer mechanism is positioned at least partially within the housing.

6. The system of claim 5, wherein the heat transfer mechanism comprises a heat-exchanger positioned within the housing.

7. The system of claim 1, wherein the heat transfer mechanism comprises a thermoelectric heat-pump.

8. The system of claim 7, wherein the thermoelectric heat-pump is a Peltier module.

9. The system of claim 7, further comprising a controller electrically coupled to the thermoelectric heat-pump.

10. The system of claim 9, wherein the controller is electrically coupled to at least one temperature sensor within the housing.

11. The system of claim 1, wherein the heat transfer mechanism comprises:
at least one heat-exchanger that is configured to be coupled to a controllable temperature source; and
at least one thermoelectric heat-pump coupled to the heat-exchanger, where the thermoelectric heat-pump is configured to transfer heat between the heat-exchanger and the electronic device.

12. The system of claim 11, wherein the heat transfer mechanism further comprises a old-plate coupled to the thermoelectric heat-pump, where the cold-plate is configured to couple to the electronic device.

13. The system of claim 12, further comprising a temperature sensor embedded into the cold-plate.

14. The system of claim 11, further comprising a temperature sensor coupled to the heat-exchanger within the housing.

15. A system for controlling the temperature of electronic devices under test, the system comprising:
a housing configured to removably enclose an electronic device coupled to a platform;
a seal configured to be positioned between the housing and the platform; and
a heat transfer mechanism coupled to the housing and configured to transfer heat between the heat transfer mechanism and the electronic device, wherein the heat transfer mechanism comprises;
at least one heat-exchanger that is configured to be coupled to a controllable temperature source; and
at least one thermoelectric heat-pump coupled to the heat-exchanger, where the thermoelectric heat-pump is configured to transfer heat between the heat-exchanger and the electronic device, and
wherein the controllable temperature source comprises:
a bath configured to contain thermally conductive fluid;
an inlet line fluidly coupling the bath to an inlet of the heat-exchanger; and
an outlet line fluidly coupling an outlet of the heat-exchanger to the bath.

16. The system of claim 15, further comprising at least one pump fluidly coupled to the inlet line and the outlet line.

17. The system of claim 16, wherein the at least one pump is electrically coupled to a controller.

18. The system of claim 1, wherein the seal is compressible.

19. The system of claim 1, further comprising one or more ports into the housing for introducing or expelling gas from within the housing.

20. The system of claim 1, wherein the housing includes a lip that, when the housing is coupled to the platform, compresses the heat transfer mechanism into contact with the electronic device.

21. The system of claim 1, further comprising an additional seal configured to be positioned on an opposite side of the platform to the electronic device.

22. The system of claim 21, wherein the additional seal covers an area of the platform at least as large as the electronic device.

23. The system of claim 22, further comprising an insulation housing configured to be coupled to the additional seal on a side of the additional seal opposite to the platform.

24. The system of claim 1, wherein the heat transfer mechanism includes a heat-exchanger embedded into the housing.

25. The system of claim 1, wherein the heat transfer mechanism is positioned on the outside of the housing.

26. The system of claim 1, further comprising multiple additional electronic Devices coupled to the platform within the housing.

27. A system for controlling the temperature of electronic devices under test, the system comprising:
a housing configured to removably enclose multiple electronic devices coupled to a platform;
a seal configured to be compressed directly between the housing and the platform; and
a heat transfer mechanism coupled to the housing and configured to transfer heat between the heat transfer mechanism and the electronic device.

28. The system of claim 27, wherein the housing has five walls that define an open side configured to receive the electronic device there through.

29. The system of claim 27, further comprising a fastening mechanism configured to removably attach the housing to the platform.

30. The system of claim 27, wherein the heat transfer mechanism is positioned at least partially within the housing.

31. The system of claim 30, wherein the heat transfer mechanism comprises a heat-exchanger positioned within the housing.

32. The system of claim 30, wherein the heat transfer mechanism comprises a thermoelectric heat-pump.

33. The system of claim 27, wherein the heat transfer mechanism comprises:
at least one heat-exchanger that is configured to be coupled to a controllable temperature source; and
at least one thermoelectric heat-pump coupled to the heat-exchanger, where the thermoelectric heat-pump is configured to transfer heat between the heat-exchanger and the electronic device.

34. The system of claim 33, wherein the heat transfer mechanism further comprises a cold-plate coupled to the thermoelectric heat-pump, where the cold-plate is configured to couple to the multiple electronic devices 35. A system for controlling the temperature of electronic devices under test, the system comprising:
a housing configured to removably enclose multiple electronic devices coupled to a platform:
a seal configured to be positioned between the housing and the platform: and
a heat transfer mechanism coupled to the housing and configured to transfer heat between the heat transfer mechanism and the electronic device, wherein the heat transfer mechanism comprises:
at least one heat-exchanger that is configured to be coupled to a controllable temperature source: and
at least one thermoelectric heat-pump coupled to the heat-exchanger, where the thermoelectric heat-pump is configured to transfer heat between the heat-exchanger and the electronic device, and wherein the controllable temperature source comprises:
a bath configured to contain thermally conductive fluid;
an inlet line fluidly coupling the bath to an inlet of the heat-exchanger; and an outlet line fluidly coupling an outlet of the heat-exchanger to the bath.

36. The system of claim 27, wherein the seal is compressible.

37. A system for controlling the temperature of electronic devices under test, the system comprising:
a housing configured to removably enclose multiple electronic devices coupled to a platform:
a seal configured to be positioned between the housing and the platform: and
a heat transfer mechanism coupled to the housing and configured to transfer heat between the heat transfer mechanism and the electronic device, further comprising an additional seal configured to be positioned on an opposite side of the platform to the electric device.

38. A system for testing multiple electronic devices, the system comprising:
a housing configured to removably enclose one or more of multiple electronic devices coupled to a platform;
a seal coupled to the housing and configured to be compressed directly during testing between the housing and the platform; and
a heat transfer mechanism coupled to the housing and configured to transfer heat between the heat transfer mechanism and the electronic device;
a mechanism for sequentially enclosing each of said one or more of said multiple electronic devices.

39. A system for testing multiple electronic devices, the system comprising:
a housing configured to removably enclose one or more of multiple electronic devices coupled to a platform:
a seal coupled to the housing and configured to be positioned during testing between the housing and the platform: and
a heat transfer mechanism coupled to the housing and configured to transfer heat between the heat transfer mechanism and the electronic device:
a mechanism for sequentially enclosing each of said one or more of said multiple electronic devices, wherein said mechanism comprises an arm that raises and lowers the housing over different electronic devices.

40. The system of claim 38, wherein movement of said arm is controlled by a Controller without human intervention after initiation.

41. The system of claim 38, wherein said mechanism is configured to move said platform.

* * * * *

UNITED STATES PATENT AND TRADEMARK OFFICE
CERTIFICATE OF CORRECTION

PATENT NO. : 7,457,117 B2  Page 1 of 1
APPLICATION NO. : 11/505572
DATED : November 25, 2008
INVENTOR(S) : Tsunwai Gary Yip et al.

It is certified that error appears in the above-identified patent and that said Letters Patent is hereby corrected as shown below:

In claim 12, column 7, line 22, change "old-plate" to --cold-plate--.

In claim 26, column 8, line 12, change "Devices" to --devices--.

In claim 40, column 10, line 18, change "Controller" to --controller--.

Signed and Sealed this

Tenth Day of February, 2009

JOHN DOLL
*Acting Director of the United States Patent and Trademark Office*